(12) United States Patent
Dutschke

(10) Patent No.: US 11,161,217 B2
(45) Date of Patent: Nov. 2, 2021

(54) METHOD FOR POLISHING A SEMICONDUCTOR WAFER ON BOTH SIDES

(71) Applicant: SILTRONIC AG, Munich (DE)

(72) Inventor: Vladimir Dutschke, Lengefeld (DE)

(73) Assignee: SILTRONIC AG, Munich (DE)

( * ) Notice: Subject to any disclaimer, the term of this patent is extended or adjusted under 35 U.S.C. 154(b) by 383 days.

(21) Appl. No.: 16/340,223

(22) PCT Filed: Oct. 27, 2017

(86) PCT No.: PCT/EP2017/077571
§ 371 (c)(1),
(2) Date: Apr. 8, 2019

(87) PCT Pub. No.: WO2018/086912
PCT Pub. Date: May 17, 2018

(65) Prior Publication Data
US 2020/0039020 A1 Feb. 6, 2020

(30) Foreign Application Priority Data
Nov. 10, 2016 (DE) .......................... 102016222063.2

(51) Int. Cl.
*B24B 37/04* (2012.01)
*H01L 21/306* (2006.01)

(52) U.S. Cl.
CPC ...... *B24B 37/042* (2013.01); *H01L 21/30625* (2013.01)

(58) Field of Classification Search
CPC ..... B24B 37/042; B24B 53/017; B24B 37/24; B24B 37/08; H01L 21/30625; H01L 21/304; H01L 21/02013; H01L 21/02016; B24D 18/0009; B24D 18/0072
USPC ................................. 438/690–693
See application file for complete search history.

(56) References Cited

U.S. PATENT DOCUMENTS

| | | | |
|---|---|---|---|
| 5,039,556 A | 8/1991 | Cogliano et al. | |
| 5,510,175 A | 4/1996 | Shiozawa | |
| 6,299,514 B1 | 10/2001 | Boller | |
| 6,682,405 B2 | 1/2004 | Shimokawa | |
| 6,884,156 B2 | 4/2005 | Prasad et al. | |
| 6,905,402 B2 | 6/2005 | Allison et al. | |
| 2003/0054650 A1 | 3/2003 | Wenski et al. | |
| 2008/0102741 A1 | 5/2008 | Shih et al. | |
| 2008/0248728 A1 | 10/2008 | Kanaya et al. | |
| 2011/0308739 A1 | 12/2011 | McCutcheon et al. | |
| 2014/0206261 A1* | 7/2014 | Roettger | H01L 21/304 451/41 |
| 2014/0235143 A1* | 8/2014 | Staudhammer | B24B 53/017 451/56 |
| 2014/0287656 A1* | 9/2014 | Schwandner | B24B 37/042 451/41 |
| 2017/0008147 A1* | 1/2017 | Hara | B24B 53/017 |

FOREIGN PATENT DOCUMENTS

| | | |
|---|---|---|
| CN | 102290367 A | 12/2011 |
| DE | 100 07 390 A1 | 10/2000 |
| DE | 102008056276 A1 | 5/2010 |
| EP | 1 775 068 A1 | 4/2007 |
| EP | 2 345 505 A2 | 7/2011 |
| JP | 2001210949 A | 8/2001 |
| JP | 3224249 B2 | 10/2001 |
| JP | 2004140215 A | 5/2013 |
| TW | 200522184 | 7/2005 |
| TW | 200709894 | 3/2007 |
| TW | 201423857 A | 6/2014 |

* cited by examiner

*Primary Examiner* — Duy Vu N Deo
(74) *Attorney, Agent, or Firm* — Brooks Kushman P.C.

(57) ABSTRACT

Semiconductor wafers are polished on both sides between polishing pads of a Shore A hardness of at least 80 and a compressibility of less than 3%, attached to upper and lower polishing plates, the polishing pads attached to the upper and lower polishing plates by bonding the polishing pads to the plates, and positioning an intermediate pad having a compressibility of at least 3% between the two bonded polishing pads as an intermediate layer and then pressing together the two polishing pads with the intermediate pad situated therebetween for a period of time.

10 Claims, No Drawings

METHOD FOR POLISHING A SEMICONDUCTOR WAFER ON BOTH SIDES

CROSS REFERENCE TO RELATED APPLICATIONS

This application is the U.S. National Phase of PCT Appln. No. PCT/EP2017/077571 filed Oct. 27, 2017, which claims priority to German Application No. 10 2016 222 063.2 filed Nov. 10, 2016, the disclosures of which are incorporated in their entirety by reference herein.

BACKGROUND OF THE INVENTION

1. Field of the Invention

The invention relates to a method for polishing a semiconductor wafer on both sides.

2. Description of the Related Art

Double-sided polishing (DSP) is a method from the group of chemical-mechanical processing steps. DSP processing of semiconductor wafers is, for example, described in US 2003/054650 A1 and an apparatus suitable therefor is described in DE 100 07 390 A1. DSP comprises chemical etching by means of an alkaline solution and mechanical erosion by means of loose particles dispersed in the aqueous medium, which are brought into contact with the semiconductor wafer by a polishing pad containing no hard substances which contact with the semiconductor wafer, thus bringing about removal of material from the semiconductor wafer under pressure and relative movement.

In DSP, the working layers are in the form of polishing pads, and these are attached adhesively, magnetically, by means of interlocking (e.g., by means of hook-and-loop fastener) or by means of vacuum to the working disks, which are also referred to in DSP as "polishing plates." Both polishing plates of a DSP system are bonded to polishing pads. To ensure high quality DSP processing, both polishing pads should be bonded free of any bubbles. At the same time, it is important that the polishing pad adhere with uniform strength over the entire polishing plate. To achieve the necessary adhesion, the polishing plates are brought together under pressure for several hours after the adhesive bonding of polishing pads. This process is also called pad pressing. The pressing makes it possible for the adhesive to flow and to adhere better. Appropriate methods for pad pressing are, for example, known from EP 1 775 068 A1 and from US 2008/0248728 A1.

Polishing pads can consist of a thermoplastic or heat-curable polymer.

A multiplicity of materials are possible as a material for foamed polishing pads (foamed pads), for example polyurethane, polycarbonate, polyamide, polyacrylate, polyester, etc. A polishing pad produced from a polymer is, for example, disclosed in US 2008/0102741 A1.

However, polishing pads can also consist of foamed plates or felt substrates or fibrous substrates that are impregnated with polymers (nonwoven pad). Such a pad is, for example, described in U.S. Pat. No. 5,510,175 A.

German published specification DE 10 2008 056 276 A1 teaches a method for regulating the working gap of a double-sided polishing machine. The working gap, in which the substrate to be polished is situated, is formed by an upper and a lower working disk, each overlaid with a polishing pad (working surface). By means of an adjuster, it is possible to deform at least one working disk, and so the shape of the working gap changes and the working surfaces are as parallel as possible. It is intended that a maximally even removal of material be ensured by the regulation of the geometry of the working gap.

US 2014/0206261 A1 discloses a method for polishing at least one wafer of semiconductor material on both sides at the same time, making use of hard, barely compressible polishing pads, with a specific shape of the working gap being realized by appropriate thickness profiles of the polishing pads. This method has a positive effect with regard to the edge of the polished semiconductor wafer.

In the case of soft and compressible polishing pads, specifically the wafer slightly sinks into the working surface of the polishing pad. As a result, higher forces act upon the wafer in the edge region of the wafer than in other regions of the wafer, and so the edge becomes rounded during polishing owing to an increased removal of material.

For this reason, the use of hard and barely compressible polishing pads is advantageous. In order to be able to bond the hard and barely compressible polishing pads to the polishing plates absolutely uniformly, especially without any air bubbles or creases, the reverse sides of the polishing pads can have adhesive films applied by machine.

When bonding the polishing pads, it may be advantageous according to US 2014/0206261 A1 to heat the polishing plates, since the heating of the polishing plates causes a decrease in the viscosity of the adhesive film with simultaneous improvement in the adhesiveness of the adhesive film. Thereafter, the polishing plate overlaid with the polishing pad is cooled from the temperature set for bonding to the desired process temperature over a period of at least 3 hours, the polishing pad being pressed against the opposing polishing plate with a pressure of at least 10,000 Pa during the entire cooling operation.

However, when using hard, barely compressible polishing pads, there is the problem that insufficient adhesion of the polishing pads to the polishing plates is frequently achieved after conventional pad pressing. This is because there is, between the upper and lower polishing plate, a polishing gap of up to 300 μm arising from the particular distance between the upper and lower polishing pad. In the absence of countermeasures, the insufficient adhesion of the polishing pads also has an impact on the quality of the polished semiconductor wafers.

JP 2004140215 A1 discloses use of a polishing pad consisting of a soft and a hard pad. The two pads can be attached to one another by means of a double-sided adhesive tape. The hard pad, by means of which the semiconductor wafer is polished, can be a pad composed of foamed PU. The soft pad serves as damping between polishing plate and hard pad. Here too, there is, however, the problem that higher forces act upon the wafer in the edge region of the wafer than in other regions of the wafer.

The problems described above gave rise to the object of the invention.

SUMMARY OF THE INVENTION

The invention is directed to a method for polishing a semiconductor wafer on both sides by attaching, polishing pads of a room temperature Shore A hardness of at least 80 and having a room temperature compressibility of less than 3% to upper and lower polishing plates, a semiconductor wafer being polished on both sides between upper and lower polishing pads, characterized in that the polishing pads are attached to the upper and lower polishing plate by bonding the polishing pads to the upper and lower polishing plate; by positioning an intermediate pad having a compressibility at room temperature of at least 3% between the two bonded polishing pads as intermediate layer and by then pressing together the two polishing pads with the intermediate pad situated therebetween for a certain period of time.

DETAILED DESCRIPTION OF THE PREFERRED EMBODIMENTS

According to the invention, an intermediate pad layer is provided between upper and lower polishing pads during pad pressing. The upper and the lower polishing pad are hard and barely compressible. The pad used as intermediate layer is more compressible than the polishing pads.

The compressibility of a material describes what pressure change on all sides is required for bringing about a certain volume change. Compressibility is determined analogously to JIS L-1096 (Testing Methods for Woven Fabrics).

The pad used as the intermediate layer is only used during the pad pressing. After the pad pressing, it is removed from the polishing system.

Both foamed polishing pads (foamed pads) and polishing pads having a fibrous structure (nonwoven pads) are suitable as polishing pads having a high pad hardness and a low pad compressibility.

In one embodiment, polishing pads having a Shore A hardness of from 80 to 100 (DIN EN ISO 868) at room temperature (23° C.±2° C.) are used.

Preference is given to the use of polishing pads having a low or very low compressibility. Preferably, the compressibility of the polishing pad is less than 2.5%. More preferably, the compressibility of the polishing pad is less than 2.2%, and most preferably, the compressibility of the polishing pad is less than 2.0%. The stated compressibilities should be determined at room temperature (23° C.±2° C.).

In one embodiment, the polishing pads or the working surfaces thereof consist of a thermoplastic or heat-curable polymer and have a porous matrix (foamed pad).

A multiplicity of materials are possible as materials for the polishing pads, for example polyurethane, polycarbonate, polyimide, polyacrylate, polyester, etc.

In one embodiment, the polishing pads or the working surfaces thereof consist of solid microporous polyurethane.

In another embodiment, the polishing pads consist of foamed plates or felt substrates or fibrous substrates that are impregnated with polymers (nonwoven pad).

The thickness of the polishing pads can be from 0.7 to 1.5 mm. In one embodiment, the thickness of the polishing pads is from 0.7 to 1.3 mm, more preferably from 0.75 to 1.1 mm.

In the context of the invention, it has become apparent that, especially in the case of hard foamed polishing pads, sufficient adhesion to the polishing plates can only be ensured when a compressible intermediate layer is positioned during the pad pressing between the two pads to be pressed.

In one embodiment, the pad used as an intermediate layer consists of felt or a fibrous substrate, i.e., of a nonwoven textile.

The felt can be generated from chemical fibers or natural fibers of plant or animal origin.

In one embodiment, it is felt produced from PU elastomer fibers.

The thickness of the intermediate layer can be from 1.0 to 3.0 mm. In one embodiment, the thickness of the intermediate layer is from 1.5 to 2.6 mm.

In one embodiment, the compressibility of the pad used as an intermediate layer is 3-10%. More preferably, a compressibility of the pad used as an intermediate layer is 3.2-7.6%. The stated compressibilities should be determined at room temperature (23° C.±2° C.).

If, by contrast, pads having a compressibility of less than 3% or more than 10% are used as an intermediate layer, uniform adhesion of the polishing pads to the polishing plates is generally not achieved.

In a preferred embodiment, the pad used as an intermediate layer comprises two pad layers bonded together. According to a preferred embodiment, the thickness of one pad layer is from 0.7 to 1.3 mm.

A double-sided adhesive film, for example, is suitable for attaching the two pad layers.

The use of such an intermediate layer in the pad pressing compensates for local unevennesses and achieves uniform adhesion over the entire polishing plate.

Before the pad-pressing operation, the polishing pads are bonded to the respective polishing plates of the polishing machine.

To this end, in one embodiment of the method, the polishing pads each have an adhesive film on their reverse side. Commercially available double-sided adhesive films, which are applied to the reverse side of the polishing pads, are suitable for example.

In a further embodiment, the polishing plates are heated before the bonding of the polishing pads. For example, the polishing plates can be heated to a temperature of 40-50° C. As a result, there is a decrease in the viscosity of the adhesive film with simultaneous improvement in its adhesiveness.

After the bonding of the polishing pads, the polishing plates are, if necessary, cooled. In one embodiment, the polishing plates are cooled to the desired polishing temperature, which is generally between 10 and 50° C.

The heating and the cooling of the polishing plates before and after the bonding of the polishing pads is preferably achieved by means of an internal temperature-control element of the polishing plates.

In a preferred embodiment, the polishing plates are cooled over a period from one up to several hours.

In a further embodiment, the polishing plates are cooled during the pad pressing, which will be described in more detail below.

In one embodiment, what takes place is the pressing operation in which the two barely compressible polishing pads are pressed together with the more compressible pad situated therebetween for a certain period of time.

Preferably, the pad pressing is done at a pressure of at least 11,000 Pa.

In one embodiment, the pressing operation takes place for the duration of one or more hours.

The pressing operation preferably takes place at the bonding temperature recommended by the manufacturer of the polishing pads.

In one embodiment, the pressing operation takes place at room temperature.

In the prior art, an intermediate layer between the polishing pads when pressing together the polishing pads has not been envisaged to date. The polishing pads were bonded to the polishing plates and then pressed together. In the case of relatively soft pads, this was also possible without impairing the quality of the polished semiconductor wafers. However, in the case of hard polishing pads, a soft, compressible felt pad, for example, as intermediate layer is necessary in order to meet the requirements for the quality of the polished semiconductor wafers.

When using hard pads without an intermediate layer, it was in some cases already noticeable after the pressing operation that the pads in the inner region were insufficiently pressed, i.e., the pads had insufficient adhesion to the polishing plate.

By contrast, in the case of inventive use of an intermediate layer, the polishing pads are fully pressed on after the pressing operation, achieving a better and more homogeneous adhesion of the polishing pad, leading to a better quality of the polished semiconductor wafers.

In one embodiment of the invention, a so-called pad dressing is carried out before the two-sided polishing of a semiconductor wafer between the polishing pads attached to the polishing plates in such a manner. In this connection, the polishing pads bonded to the polishing plates are adapted before the polishing operation to the particular individual plate shape of the polishing machine. Relevant methods are known in principle from the prior art and described, for example, in the documents EP 2 345 505 A2 or U.S. Pat. No. 6,682,405 B2.

The pad dressing is advantageous, since a polishing plate can usually exhibit differences in the local evenness of up to ±50 µm. The purpose thereof is, by mechanical processing of the polishing pad situated on the polishing plate by means of suitable tools generally containing diamond abrasives, to set both a desired geometry of the polishing pad and thus a desired geometry of the polishing gap, and the desired properties of the pad surface (working surface) of the polishing pad. The polishing pad situated on the polishing plate is optimized each time for a certain polishing machine and a polishing gap.

In one embodiment, the pad dressing of the two polishing pads, i.e., the processing of the working surfaces of the polishing pads, is carried out such that a polishing gap, which is formed by the semiconductor wafer to be polished with in each case the polishing-pad surface coming into contact with the semiconductor wafer and which extends from an inner edge up to an outer edge of the polishing pad, has a differing height at the inner edge and at the outer edge of the polishing pad. In other words, the polishing pad has a different pad thickness at the center than at the outer edge.

In one embodiment of the method, the height of the polishing gap, i.e., the particular distance between the upper and lower polishing pad, is lower at the outer edge than at the inner edge of the polishing pad.

For the polishing, the semiconductor wafers are placed into a suitably dimensioned slot of a carrier. Preferably, a liquid is fed during the polishing into the working gap formed between the working layers of the polishing pads. Said liquid is preferably a polishing agent suspension. Particular preference is given to the use of colloidal-dispersion silica, optionally with additives such as, for example, sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH), as polishing agent suspensions. In the simultaneous polishing of the front side and the reverse side of the semiconductor wafer, there is preferably a surface removal of less than or equal to 15 µm per side, more preferably from 5 µm to 12 µm per side.

The advantages of the invention are elucidated below on the basis of examples and comparative examples.

Unless otherwise specified, all the parameters stated earlier and in the following examples and comparative examples were determined at a pressure of the ambient atmosphere, i.e., at about 1000 hPa, and at a relative air humidity of 50%.

Shore A hardness is determined in accordance with DIN EN ISO 868. A type A durometer is used (Zwick 3130 hardness tester). The tip of the hardened steel rod penetrates the material. The penetration depth is measured on a scale of 0-100. The steel rod has the geometry of a truncated cone. Five measurements are performed in each case, from which the median value is specified. The measurement time is 15 s, the material to be tested was stored for 1 h under standard climatic conditions (23° C., 50% air humidity). The applied weight of the durometer is 12.5 N±0.5.

COMPARATIVE EXAMPLES

Comparative Example 1

Polishing pads composed of felt (PU), Shore A hardness 60 at 23° C., compressibility 9.4% at 23° C., thickness 1.27 mm Pad pressing without intermediate layer, pressure 11,000 Pa, 2 hours After the pad pressing, there is good adhesion of the polishing pads to the polishing plates.

Comparative Example 2

Polishing pads composed of felt (composed of PU elastomer fibers), Shore A hardness 84 at 23° C., compressibility 2.6% at 23° C., thickness 1.27 mm Pad pressing without intermediate layer, pressure 11,000 Pa, 2 hours After the pad pressing, there is poor adhesion of the inner region of the polishing pads to the polishing plates. This would inevitably lead to quality deficiencies in the polishing of the semiconductor wafers.

Comparative Example 3

Foamed polishing pads (PU), Shore A hardness 93 at 23° C., compressibility 2.5% at 23° C., thickness 1.06 mm Pad pressing without intermediate layer, pressure 11,000 Pa, 2 hours After the pad pressing, there is poor adhesion of the inner region of the polishing pads to the polishing plates. This would inevitably lead to quality deficiencies in the polishing of the semiconductor wafers.

Example 1

Polishing pads composed of felt (composed of PU elastomer fibers), Shore A hardness 84 at 23° C., compressibility 2.6% at 23° C., thickness 1.27 mm Use of an intermediate layer in the pad pressing (pressure 11,000 Pa, 2 hours) Intermediate layer: double-layer PU felt, thickness of one layer 1.27 mm, compressibility 3.3% at 23° C., Shore A hardness 83 at 23° C.

After the pad pressing, there is excellent adhesion of the polishing pads to the polishing plates.

Example 2

Foamed polishing pads (PU), Shore A hardness 84 at 23° C., compressibility 2.1% at 23° C., thickness 0.86 mm Use of an intermediate layer in the pad pressing (pressure 11,000 Pa, 2 hours)

Intermediate layer: double-layer PU felt, thickness of one layer 1.27 mm, compressibility 3.3% at 23° C., Shore A hardness 83 at 23° C.

After the pad pressing, there is excellent adhesion of the polishing pads to the polishing plates.

The above description of illustrative embodiments is to be understood as being exemplary. The disclosure made thereby enables a person skilled in the art to understand the present invention and the advantages associated therewith and also comprehends alterations and modifications to the described structures and processes that are obvious to a person skilled in the art. All such alterations and modifications and also equivalents shall therefore be covered by the scope of protection of the claims.

The invention claimed is:

1. A method for polishing a semiconductor wafer on both sides, comprising polishing both sides of the wafer simultaneously between polishing pads having a room temperature Shore A hardness of at least 80 and a room temperature compressibility of less than 3% attached to upper and lower polishing plates, wherein the polishing pads are attached to the upper and lower polishing plates by bonding the polishing pads to the upper and lower polishing plates, and positioning an intermediate pad having a compressibility at room temperature of at least 3% between the two bonded polishing pads as an intermediate layer and then pressing the two polishing pads together with the intermediate pad situated therebetween for a period of time.

2. The method of claim 1, wherein the polishing pads are foamed pads based on polyurethane.

3. The method of claim 1, wherein the polishing pads have a room temperature Shore A hardness of from 80 to 100.

4. The method of claim 1, wherein the room temperature compressibility of the polishing pad is less than 2.5%.

5. The method of claim 1, wherein the intermediate pad has a room temperature compressibility of 3.2-7.6%.

6. The method as claimed of claim 1, wherein the intermediate pad comprises felt or a fibrous substrate.

7. The method of claim 6, wherein the intermediate pad comprises polyurethane elastomer fibers.

8. The method of claim 1, wherein the intermediate pad comprises two pads bonded together.

9. The method of claim 1, wherein the polishing pads have a thickness of from 0.75 to 1.1 mm.

10. The method of claim 1, wherein the intermediate pad has a thickness of from 1.5 to 2.6 mm.

* * * * *